(12) United States Patent  (10) Patent No.: US 8,489,053 B2
Peavey et al.  (45) Date of Patent: Jul. 16, 2013

(54) COMPENSATION OF LOCAL OSCILLATOR PHASE JITTER

(75) Inventors: David Peavey, Fremont, CA (US); Oren Arad, Palo Alto, CA (US)

(73) Assignee: SiPort, Inc., Santa Clara, CA (US)

( * ) Notice: Subject to any disclaimer, the term of this patent is extended or adjusted under 35 U.S.C. 154(b) by 150 days.

(21) Appl. No.: 13/007,654

(22) Filed: Jan. 16, 2011

(65) Prior Publication Data
US 2012/0184235 A1  Jul. 19, 2012

(51) Int. Cl.
*H04B 1/06* (2006.01)
*H04K 3/00* (2006.01)

(52) U.S. Cl.
USPC .......................................... 455/255; 331/1 R

(58) Field of Classification Search
USPC ................ 455/196.1, 255–260, 265; 331/1 R
See application file for complete search history.

(56) References Cited

U.S. PATENT DOCUMENTS

| | | | |
|---|---|---|---|
| 4,710,747 A | 12/1987 | Holland | |
| 4,761,644 A | 8/1988 | Kawai et al. | |
| 4,910,752 A | 3/1990 | Yester, Jr. et al. | |
| 5,140,698 A | 8/1992 | Toko | |
| 5,155,479 A | 10/1992 | Ragan | |
| 5,325,088 A | 6/1994 | Willard et al. | |
| 5,555,183 A | 9/1996 | Willard et al. | |
| 5,640,670 A | 6/1997 | Samueli et al. | |
| 5,654,952 A | 8/1997 | Suzuki et al. | |
| 5,870,439 A | 2/1999 | Ben-Efraim et al. | |
| 5,920,824 A | 7/1999 | Beatty et al. | |
| 6,031,827 A | 2/2000 | Rikkinen et al. | |
| 6,057,795 A | 5/2000 | Suzuki | |
| 6,072,784 A | 6/2000 | Agrawal et al. | |
| 6,104,250 A * | 8/2000 | Eckersten et al. | ................ 331/2 |
| 6,205,225 B1 | 3/2001 | Orban | |
| 6,219,333 B1 | 4/2001 | Ahn | |
| 6,232,905 B1 | 5/2001 | Smith et al. | |
| 6,259,681 B1 | 7/2001 | Kolev et al. | |
| 6,286,122 B1 | 9/2001 | Alanara | |
| 6,311,048 B1 | 10/2001 | Loke | |
| 6,317,065 B1 | 11/2001 | Raleigh et al. | |
| 6,405,062 B1 | 6/2002 | Izaki | |
| 6,405,602 B1 | 6/2002 | Itou et al. | |
| 6,407,689 B1 | 6/2002 | Bazarjani et al. | |
| 6,438,364 B1 | 8/2002 | Waite | |
| 6,466,913 B1 | 10/2002 | Yasuda et al. | |
| 6,504,863 B1 | 1/2003 | Hellmark | |
| 6,654,595 B1 | 11/2003 | Dexter | |
| 6,671,371 B1 | 12/2003 | McNeill et al. | |
| 6,693,953 B2 | 2/2004 | Cox et al. | |
| 6,754,763 B2 | 6/2004 | Lin | |
| 6,763,240 B1 | 7/2004 | Chambers et al. | |
| 6,765,931 B1 | 7/2004 | Rabenko et al. | |
| 6,819,274 B2 | 11/2004 | Krone et al. | |
| 6,862,325 B2 | 3/2005 | Gay-Bellile et al. | |
| 6,864,817 B1 | 3/2005 | Salvi et al. | |
| 6,993,291 B2 | 1/2006 | Parssinen et al. | |
| 7,006,617 B1 | 2/2006 | Dal Farra et al. | |

(Continued)

FOREIGN PATENT DOCUMENTS
JP   2007-243504   9/2007

*Primary Examiner* — Lee Nguyen
(74) *Attorney, Agent, or Firm* — Carr & Ferrell LLP

(57) ABSTRACT

Digital logic circuitry is disclosed. The circuitry includes local oscillator drift and phase compensation logic that compensates the frequency drift and the phase noise of a local oscillator generated by a digitally controlled oscillator.

20 Claims, 5 Drawing Sheets

U.S. PATENT DOCUMENTS

| | | |
|---|---|---|
| 7,127,008 B2 | 10/2006 | Kroeger |
| 7,205,923 B1 | 4/2007 | Bahai |
| 7,233,275 B2 | 6/2007 | Aksin et al. |
| 7,295,812 B2 | 11/2007 | Haapoja et al. |
| 7,299,021 B2 | 11/2007 | Parssinen et al. |
| 7,302,013 B2 | 11/2007 | Samueli et al. |
| 7,369,989 B2 | 5/2008 | Absar et al. |
| 7,480,689 B2 | 1/2009 | Song |
| 7,512,743 B2 | 3/2009 | Tom et al. |
| 7,519,330 B2 | 4/2009 | Gumm |
| 7,555,661 B2 | 6/2009 | Luu |
| 2002/0067825 A1 | 6/2002 | Baranowski et al. |
| 2002/0126778 A1 | 9/2002 | Ojard et al. |
| 2002/0169009 A1 | 11/2002 | Reiner |
| 2003/0078007 A1 | 4/2003 | Parssinen et al. |
| 2003/0159076 A1 | 8/2003 | Delisle et al. |
| 2004/0080675 A1 | 4/2004 | Hoshino |
| 2004/0145508 A1 | 7/2004 | Gulati et al. |
| 2004/0203537 A1 | 10/2004 | Yoshida et al. |
| 2004/0223449 A1 | 11/2004 | Tsuie et al. |
| 2005/0047488 A1 | 3/2005 | Sugahara |
| 2005/0081245 A1 | 4/2005 | Arad et al. |
| 2005/0094036 A1 | 5/2005 | Tichelaar |
| 2005/0094840 A1 | 5/2005 | Harano |
| 2005/0113136 A1 | 5/2005 | Gosieski |
| 2005/0239518 A1 | 10/2005 | D'Agostino et al. |
| 2006/0001779 A1 | 1/2006 | Favrat et al. |
| 2006/0003729 A1 | 1/2006 | Tuttle et al. |
| 2006/0082690 A1 | 4/2006 | Englert |
| 2006/0112157 A1 | 5/2006 | Song |
| 2006/0141974 A1 | 6/2006 | Campbell et al. |
| 2006/0195498 A1 | 8/2006 | Dobbek et al. |
| 2006/0212503 A1 | 9/2006 | Beckmann et al. |
| 2007/0080800 A1 | 4/2007 | Carbone et al. |
| 2007/0105576 A1 | 5/2007 | Gupta et al. |
| 2007/0112901 A1 | 5/2007 | Niktash et al. |
| 2007/0176816 A1 | 8/2007 | Wood |
| 2008/0086756 A1 | 4/2008 | Kagle et al. |
| 2008/0097764 A1 | 4/2008 | Grill et al. |
| 2009/0198753 A1 | 8/2009 | Benjelloun Touimi |
| 2010/0150276 A1 | 6/2010 | Yew et al. |

* cited by examiner

COMPENSATION OF LOCAL OSCILLATOR PHASE JITTER

BACKGROUND OF THE INVENTION

1. Field of the Invention

The present invention generally relates to digital communication radio receivers. More specifically, the present invention concerns compensation of frequency drift and phase noise of a local oscillator in the radio receiver.

2. Description of the Related Art

Digital communication radio receivers commonly use a radio frequency front end (RF-FE) to down convert a desired signal, modulated on some radio frequency (RF) carrier, to a lower intermediate frequency (IF) or a zero IF frequency (DC). The mixed signal can be sampled by an analog to digital converter and processed using known digital signal processing techniques to demodulate the received signal and extract transmitted information bits. In order to down mix the signal, however, the RF-FE typically generates a sinusoidal signal, which multiplies the received signal and creates the mix-down operation. This sinusoidal signal is commonly known as the local oscillator (LO) signal.

The LO is commonly generated using a voltage controlled oscillator (VCO) that is controlled by a phase locked loop (PLL). The PLL tracks a reference clock to ensure that LO has a stable frequency. The PLL circuitry, however, requires a considerable amount of power to be able to stabilize the LO. In addition, the PLL usually requires a narrow low pass filter in order to filter out noise from the reference clock and provide a low noise feedback to the VCO. Implementing such a filter in an integrated circuit RF-FE design requires considerable area for the circuit or additional external components that increases the cost of the receiver.

To address the footprint of the filter, the PLL controlled VCO is replaced with a digitally controlled oscillator (DCO) in some RF-FE receivers. The DCO output frequency can be controlled by adding or subtracting capacitance to an oscillator, which changes the oscillation frequency. A DCO circuit generally consumes less power than a PLL controlled VCO and generates less of a footprint. The DCO is, therefore, a compelling solution for LO generation, especially in IC RF-FE used in battery powered handheld devices.

The disadvantage of using DCO, however, is that the LO frequency generated by a DCO is not as stable as an LO frequency generated by a VCO controlled by a PLL. The DCO frequency can drift by a large percentage when the receiver temperature changes or when there are even small changes to the supply voltage of the DCO circuitry. The LO generated by the DCO will also have a higher phase noise than an LO generated by a PLL controlled VCO. As most digital modulated communication signals require high accuracy, low phase noise, and high stability of the LO to successfully demodulate a received signal, even a slight variance can be extremely detrimental to system operations.

Even worse, a rapid and large drift in the IF frequency, caused by the DCO generated LO drift will significantly degrade the quality of the demodulation by introducing errors in the decoded bits. For this reason, DCOs are not commonly used in an RF-FE intended for decoding digitally modulated signals, but instead used in RF-FE receivers for demodulating frequency modulated (FM) signals, where the frequency drift of the LO is not harmful for the demodulation.

There is a need in the art to digitally compensate for DCO frequency drift whereby a DCO generated LO can be used to down convert a digitally modulated signal in order to enjoy significant power and cost advantage over traditional VCO with PLL RF-FE.

SUMMARY OF THE CLAIMED INVENTION

A method for compensating local oscillator phase jitter is provided in a first claimed embodiment of the present invention. Through the claimed embodiment, a radio frequency signal is down converting to a sampled stream of an intermediate frequency using a digitally controlled oscillator. A phase correction term is then generated using a local oscillator signal and external clock source, the phase correction term including an estimate of LO frequency drift and phase jitter. The sampled data stream is then multiplied with the phase correction term to compensate for frequency drift and phase jitter introduced by the digitally controller oscillator.

DETAILED DESCRIPTION

Embodiments of the present invention provide for or are related to digital logic circuitry, including local oscillator drift and phase compensation logic. The local oscillator drift and phase compensation logic is added to digital signal processing hardware to allow for compensation of frequency drift and phase noise of a local oscillator generated by a digitally controlled oscillator.

Figure 1:
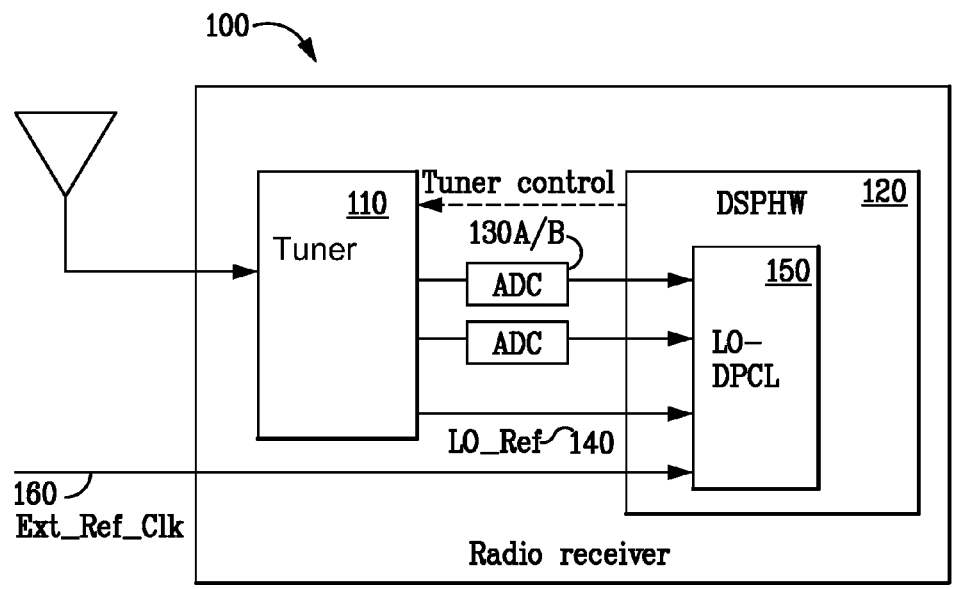
FIG. 1 illustrates a radio frequency receiver that receives communication signals transmitted over a given radio frequency.

FIG. 1 illustrates a radio frequency receiver 100 that receives communication signals transmitted over a given radio frequency (RF). The receiver 100 of FIG. 1 includes a tuner 110 and digital signal processing hardware 120 (DSPHW). The tuner 110 is capable of being tuned to a desired communications channel transmitted over a specific RF band by way of tuner control in the DSPHW. The tuner 110 then down converts the channel to some intermediate frequency (IF) or to zero frequency (DC). The down converted signal can then be sampled by a single or two analog to digital converters (ADCs) 130A and 130B to form a digital representation of the down converted signal. The DSPHW 120 can be hard wired digital logic, hard programmable digital logic, a programmable processor, or a combination of the foregoing.

The receiver 100 of FIG. 1 also illustrates a local oscillator reference (LO_Ref) clock signal 140. The LO_Ref signal 140 is formed from or is a replica of the local oscillator (LO) signal output from tuner 110. In some embodiments, the LO_Ref signal 140 may be a known frequency divider of the LO signal. The LO_Ref signal 140 is provided as input to local oscillator drift and phase compensation logic (LO-DPCL) 150, which is implemented with or capable of accessing digital logic circuitry to demodulate the sampled signal and recover information bits that were modulated in the transmitted signal.

The receiver 100 of FIG. 1 also includes an external reference clock (Ext_Ref_Clk) signal 160. The Ext_Ref_Clk signal 160 can be provided to the receiver 100 from a stable external clock source such as a crystal oscillator. Other components capable of generating a stable clock signal may, however, be implemented instead of the aforementioned oscillator. In some instances, the reference clock may be generated internally by the receiver 100, for example, a crystal coupled to oscillating circuitry.

Figure 2:
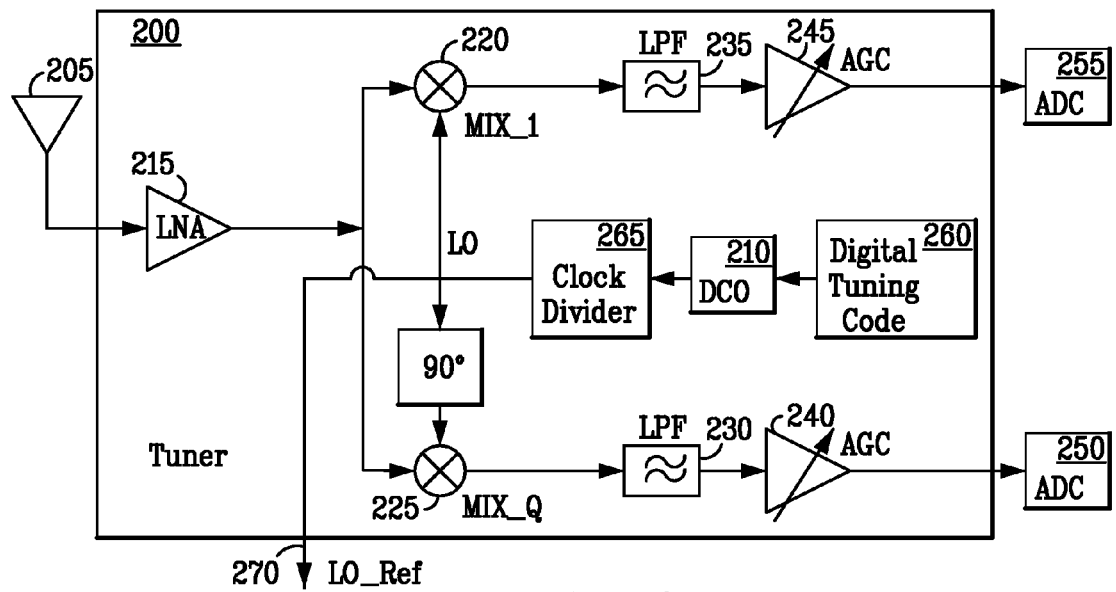
FIG. 2 illustrates a tuner with local oscillation generated by a digitally controlled oscillator.

FIG. 2 illustrates a tuner 200 with local oscillation generated by a digitally controlled oscillator (DCO) 210. The tuner 200 of FIG. 2 illustrates a direct conversion architecture, said architecture generally being known in the art. Notwithstanding the reference to direct conversion architecture, the present invention may be implemented in the context of other architectures such as dual conversion, super heterodyne, or variants of the same. Tuner 200 of FIG. 2 generally corresponds to tuner 110 as illustrated in the context of FIG. 1.

An RF signal is received by antenna 205 of tuner 200. The received signal is first amplified by low noise amplifier 215 (LNA). The amplified signal is then split into two branches: an inphase branch and a quadrature phase. The signal in the inphase branch is multiplied in mixer 220 (MIX_I) with a sinusoid local oscillator signal (LO). The signal on the quadrature branch is processed at mixer 225 (MIX_Q) with the same LO sinusoid signal albeit shifted by 90 degrees. The mixing of the received signal with the LO signal produces a replica of the signal centered on a low intermediate frequency (IF) or centered on zero frequency (DC).

The down converted signal is then passed through low pass filters 230 and 235 (LPF) that reject signals that are outside the frequency range of the desired signal. Automatic gain control circuitry 240 and 245 (AGC) adjusts the filtered signal power to a level sufficient to preserve the dynamic range of the signal at the output of the ADCs 250 and 255. The AGC outputs are sent to ADCs 250 and 255 for sampling.

The LO sinusoidal signal is generated from the digital controlled oscillator 210 (DCO). The LO sinusoidal signal may be directly derived from the DCO 210 or may be some division for the DCO output frequency. In the latter instance, said signal may be created by dividing the frequency of the DCO output by clock dividing circuitry 265.

The DCO 210 is programmed by the DSPHW (120 of FIG. 1) by way of digital tuning code 260 (DTC), which may be maintained in software, hardware, or a combination of the two. In one implementation of DCO 210, the DTC 260 controls a capacitor array (not shown) inside the DCO 210. The capacitor array is coupled to an inductor to create oscillating circuitry that oscillates at a resonant frequency determined by the value of the inductor and the coupled capacitor.

Increasing the value of the DTC 260 increases the capacitance coupled to an oscillator, thereby decreasing the resonant frequency of the oscillator. As a result, a lower frequency LO is produced. Decreasing the value of the DTC 260, however, decreases the capacitance coupled to an oscillator, thereby increasing the resonant frequency of the oscillator; the end result is a higher frequency LO.

In another implementation of DCO 210 implementation, the DTC 260 is controlling a voltage produced by a digital to analog converter (DAC) (not shown). The DAC will produce a voltage proportional to the DCT value whereby the output of the DAC controls a voltage controller oscillator (VCO) (not shown). By increasing the DCT values, the DAC output voltage will increase, which will result in a corresponding increase of the frequency output of the DCO 210.

Methods of implementing a digital controller oscillator are generally known in the art. Embodiments of the present invention may be applied to various DCO implementations, whereby a DCT can be applied to a DCO to control the LO frequency output produced by the DCO.

A replica of the LO signal is output from the tuner block to form the LO reference (LO_Ref) signal 270, which corresponds to the similarly labeled signal in FIG. 1 (140). The LO-Ref is provided as input to the LO-DPCL circuitry (150 of FIG. 1). The LO reference signal may be the LO itself or a known M/N factor of the LO frequency, where M/N are some known integer values.

Figure 3:
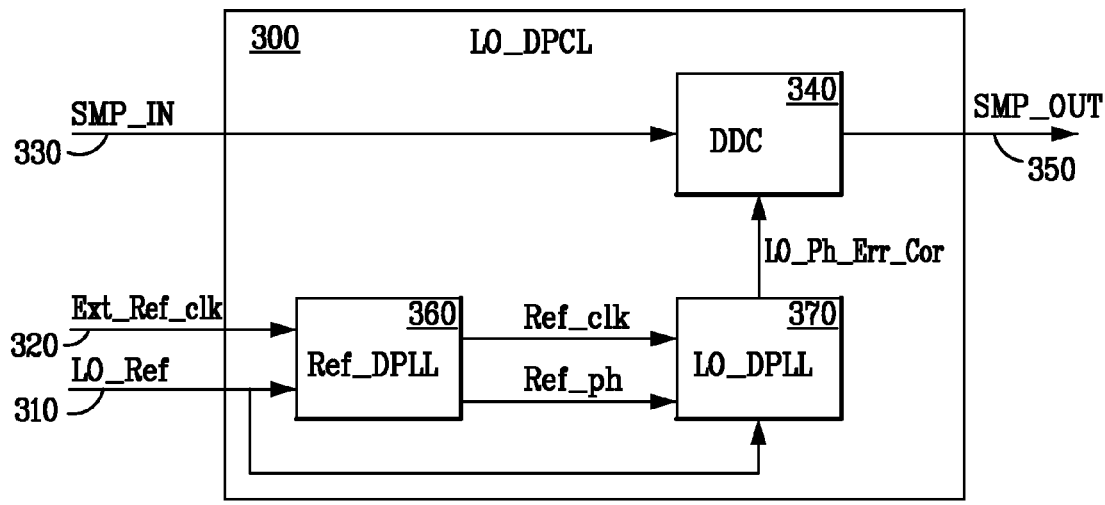
FIG. 3 illustrates local oscillator drift and phase compensation logic.

FIG. 3 illustrates local oscillator drift and phase compensation logic 300. The LO-DPCL as illustrated in FIG. 3 receives an LO_REF reference signal 310, Ext_Ref_Clk reference signal 320, and SMP_IN signal 330. LO_Ref signal 310 corresponds to a LO reference clock signal, which is a replica of the replica of the LO signal, or some known frequency divider of the LO signal. Ext_Ref_Clk signal 320 corresponds to an external reference clock signal. As reference above, the external reference clock can be provided from a stable external clock source such as crystal oscillator or any other component in the device that can generate a stable clock signal, including internally through an oscillating circuitry coupled with a crystal. SMP_IN signal 330 corresponds to a sampled IF or Zero IF signal stream coming from the ADC 130 in FIG. 1. The samples may be a complex number sequence, coming from two ADCs, or a real number sequence coming from a single ADC. The sample from the ADC may go directly into the LO-DPCL (300 of FIGS. 3 and 150 of FIG. 1). In some embodiments, the samples from the ADC may be decimated and or filtered before going into the LO-DPCL.

The digital down converter 340 (DDC) rotates the phase of the input complex signal SMP_IN by the phase amount specified by LO_Ph_Err_cor to compensate for the LO phase jitter and frequency drift. Operation of DDC 340 is described in further detail with respect to FIG. 6. The LO_DPCL block 300 of FIG. 3 uses LO_Ref signal 310 and Ext_Ref_clk signal 320 to generate a sample by sample phase compensation for the SMP_IN sample signals 330 to produce SMP_OUT sample stream 350. REF_DPLL block 360 and LO_DPLL block 370 are described in further detail with respect to FIGS. 4 and 5, below.

Figure 4:
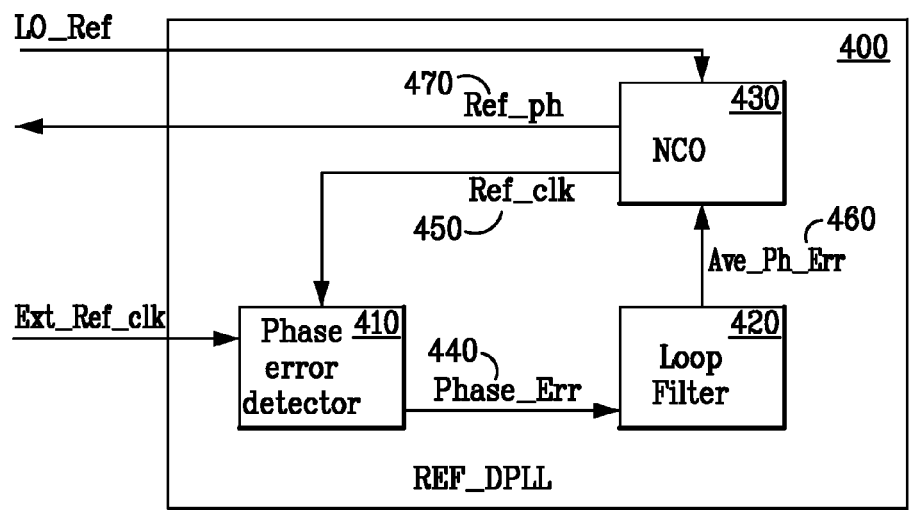
FIG. 4 illustrates Ref_DPLL block of FIG. 3, which corresponds to digital phase lock loop logic.

FIG. 4 illustrates Ref_DPLL block 400 of FIG. 3, which corresponds to digital phase lock loop (DPLL) logic. REF_DPLL block 400 generates a filtered version of the reference clock, sampled by the LO_Ref clock. The REF_DPLL block 400 includes phase error detector 410, loop filter 420, and numerically controller oscillator 430 (NCO).

Phase error detector 410 produces the output Phase_Err signal 440, which is proportional to the accumulated phase difference between the clock signals Ext_Ref_clk (320 of FIG. 3) to the clock signal Ref_clk 450. In one example, the phase error is calculated by implementing the following calculation:

$$\text{Phase\_Err}[n] = \sum_{i=n0}^{n} \{N \cdot \text{Ext\_Ref\_clk}[i] - M \cdot \text{Ref\_Clk}[i]\}$$

where N and M are integers that are selected such that N/M is approximately the ratio between Ext_Ref_Clk frequency to Ref_Clk frequency. Other methods to generate Phase_Err 440 by comparing Ext_Ref_Clk to Ref_Clk 450 can be used without diverging from the general spirit of the present invention.

Loop Filter 420 produces a Ave_Ph_Err 460, which is a filtered version of Phase_Err 440. In one exemplary embodiment, the phase error is calculated by implementing the following calculation:

Ave_Ph_Err[n]=β·Ave_Ph_Err[n−1]+α·Phase_Err[n]

where α are β some fractional values.

Other methods to generate Ave_Ph_Err 460 by filtering Phase_Err 440 may be used without diverging from the general spirit of the present invention.

NCO 430 produces a smooth version of the Ext_Ref_clk (320 of FIG. 3) sampled at the LO_Ref clock rate (310 of FIG. 3) by generating Ref_clk 450 and Ref_ph 470. The NCO 430 performs the following calculation:

NCO_ACC[n]=NCO_ACC[n−1]+Nom_Freq+Ave_Ph_Err[n]

The above calculation of the NCO 430 occurs every cycle of the LO_Ref signal (310 of FIG. 3) thereby making the NCO circuitry clocked by the LO_Ref.

Ref_clk and Ref_ph are derived from NCO_ACC with the following calculations:

Ref_Clk[n]=overflow(NCO_ACC[n])

Ref_Ph[n]=modulo(NCO_ACC[n])

Other methods to generate Ref_Clk 450 and Ref_Ph 470 from the averaged phase errors may be used.

Figure 5:
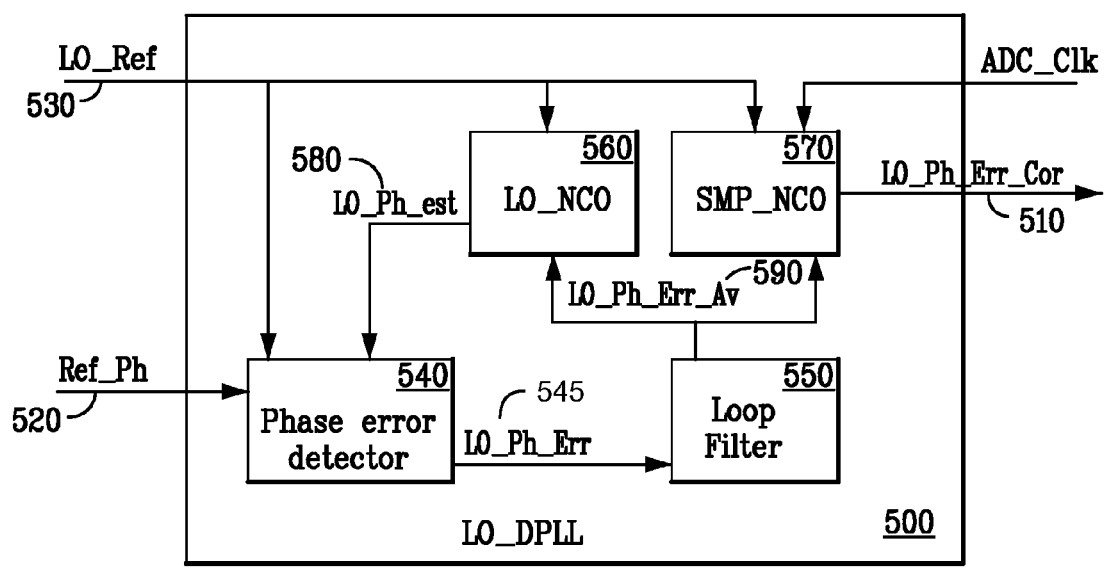
FIG. 5 illustrates the LO_DPLL block of FIG. 3, which corresponds to digital phase lock loop (DPLL) logic.

FIG. 5 illustrates, in detail, the LO_DPLL block 370 of FIG. 3, and which corresponds to the local oscillator drift and phase compensation logic (LO-DPCL). LO_DPLL 500 generates an LO phase error correction signal 510 (LO_Ph_Err_Cor), which compensates for the LO phase jitter and frequency drift. LO_Ph_Err_Cor signal 510 is calculated by comparing the filtered External clock reference phase 520 (Ref_Ph) to the LO_Ref phase 530. With an external reference clock operating as a stable clock source, the error between the reference phase to the LO phase is a result of the LO phase jitter and drift and can be used to compute the needed compensation term LO_Ph_Err_Cor 510. LO_DPLL block 500 includes phase error detection 540, loop filter 550, LO numerically controlled oscillator (LO_NCO) 560, and sample rate numerically controlled oscillator 570 (SMP_NCO).

Phase error detector 540 compares the phase of the filtered version of the reference clock 520 (Ref_Ph) to the phase of the LO_Ref 530 corrected by the estimated LO phase error 580 (LO_Ph_est). Phase error detector 540 produces the output LO_Ph_Err 545, which is proportional to the accumulated phase difference between the clock signals Ref_clk to the LO signal LO_Ref 530 corrected by LO_Ph_est 580. In one embodiment, the phase error is calculated by implementing the following calculation:

LO_Ph_Err[n]=Ref_Ph[n]−LO_Ph_Est[n]−n·M/N

This calculation is performed every LO_Ref cycle where N and M are integers that are selected such that N/M is the ratio between the desired LO_Ref frequency to the Ref_clk. Other methods to generate LO_Ph_Err from to LO_Ph_Est may be implemented in the context of the present invention.

Loop Filter 550 produces a LO_Ph_Err_Av 590, which corresponds to a filtered version of LO_Ph_Err. In one exemplary implementation the phase error is calculated by implementing the following calculation:

LO_Ph_Err_Av[n]=β·LO_Ph_Err_Av[n−1]+α·LO_Ph_Err[n]

where α are β some fractional values. Other methods to generate LO_Ph_Err_Av 590 by filtering LO_Ph_Err may be used.

LO Numerically controlled oscillator 560 (LO_NCO) generates an estimated LO phase 580 (LO_Ph_est), sampled at the LO_Ref 530 clock rate by performing the following calculation:

LO_NCO_ACC[n]=LO_NCO_ACC[n−1]+Nom_LO_Freq+LO_Ph_Err_Av[n]

The above calculation of the NCO occurs every cycle of the LO_Ref 530 signal, thereby making the NCO circuitry clocked by the LO_Ref. Other methods may be used to generate LO_Ph_est from the filtered LO phase errors.

Sample rate numerically controlled oscillator 570 (SMP_NCO) converts the LO_Ph_Err_Av 590 from a sampling rate of LO_ref 530 to the sampling rate of SMP_Clk, the sample rate coming from the ADC into the LO_DPCL block. SMP_clk may be equivalent to the sampling rate of the ADC. SMP_clk may also be equivalent to some division of the ADC sampling clock if the sampled IF signal has been decimated after the ADC and before being processed by the LO-DPCL block.

Figure 6:
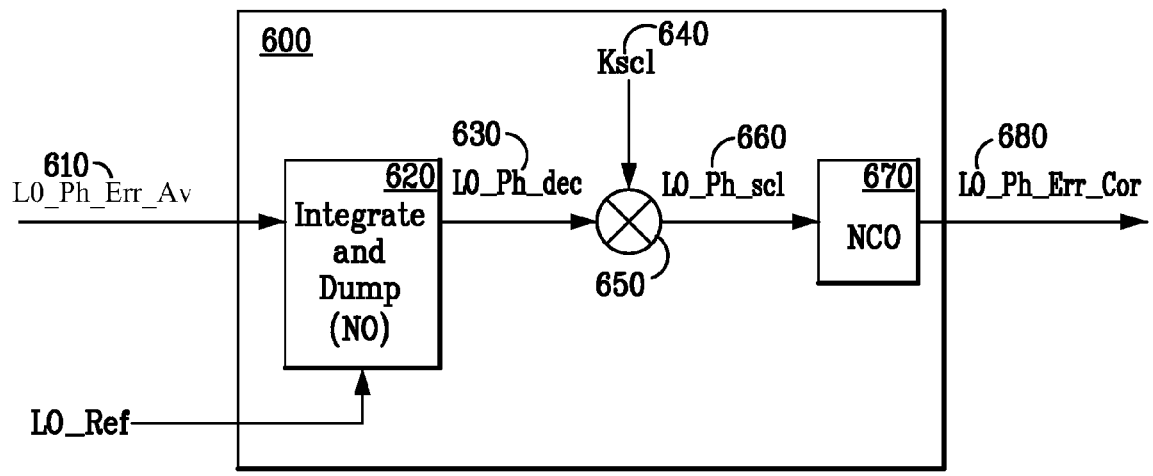
FIG. 6 illustrates the conversion of the LO-Ph_Err_Av to SMP_clk clock rate.

FIG. 6 illustrates the conversion 600 of the LO-Ph_Err_Av to SMP_clk clock rate. First LO_Ph_Err_Av 610 is decimated by a ratio of N0=$F_{LO\_Ref}/F_{SMP\_clk}$ (620) to create the signal LO_ph_dec (630), where $F_{LO\_Ref}$ is the frequency of LO_Ref, and $F_{SMP\_clk}$ is the frequency of the sample clock. LO_ph_dec 630 is, therefore, a sequence of LO phase estimations that are sampled at the rate of SMP_Clk.

One example of implementation for decimating LO_Ph_Err_Av 610 is by integrating an average of N0 samples of LO_Ph_Err_Av 610 to produce a single LO_Ph_dec 630 sample. LO_ph_scl 660 is calculated from Kscl 640 and LO_Ph_dec 630 using multiplier 650 as follows:

$$LO\_Ph\_scl[n] = Kscl \cdot LO\_Ph\_dec[n]$$

The above calculation of LO_Ph_scl 660 occurs every cycle of SMP_clk. In this equation, Kscl=R*N1/M1, and R=$F_{LO}/F_{LO\_Ref}$ and $F_{LO}$ is the LO frequency used to down convert the RF signal to IF, and $F_{LO\_Ref}$ is the LO_Ref frequency that may be equal to $F_{LO}$, (in that case R=1) or some division of $F_{LO}$. N1/M1=$F_{LO\_Ref}/F_{Ref\_clk}$ (i.e., the ratio between the LO_Ref frequency to REF_clk frequency).

LO_Ph_scl 660 is input to an NCO 670 that performs the following calculation:

$$SMP\_NCO\_ACC[n] = SMP\_NCO\_ACC[n-1] + LO\_Ph\_scl[n]$$

$$LO\_Ph\_Err\_cor[n] = modulo(SMP\_NCO\_ACC[n])$$

The above calculation of the NCO 670 is occurring every cycle of SMP_clk.

LO_Ph_Err_cor 680 is the estimated LO phase error correction, sampled at SMP_clk. Other methods to generate LO_Ph_Err_cor 680 from LO_Ph_Err_Av 610 phase errors may be used in accordance with the present invention.

Figure 7:
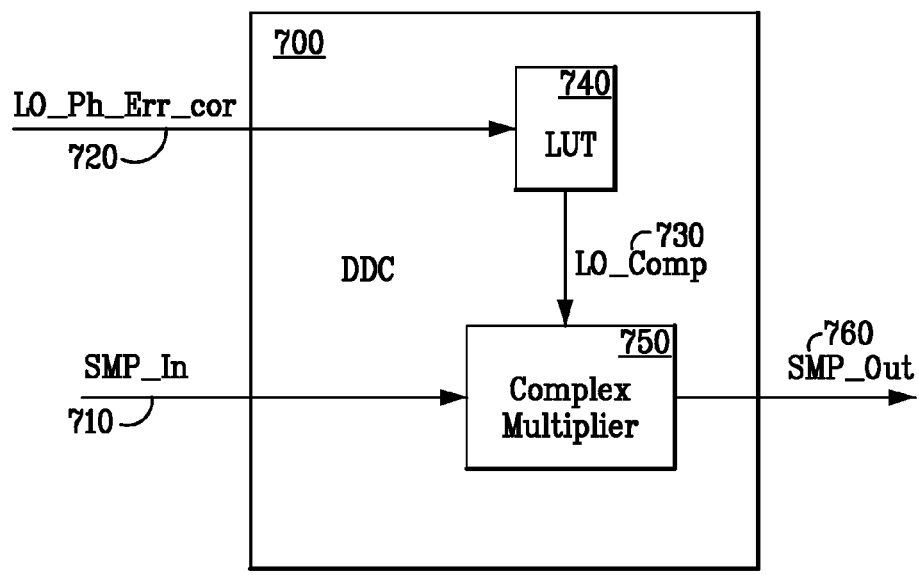
FIG. 7 illustrates an example of digital down conversion.

FIG. 7 illustrates an example of digital down conversion (DDC) 700, which corresponds to block 340 of FIG. 3. DDC rotates the phase of the input complex signal SMP_in 710 by the phase amount specified by LO_Ph_Err_cor 720 to compensate for the LO phase jitter and frequency drift. LO_Comp 730 is calculated by look up table 740 (LUT) from LO_Ph_Err_Cor 720 as follows:

$$LO\_Comp[n] = \cos(2 \cdot \pi \cdot LO\_Ph\_Err\_cor) - j \cdot \sin(2 \cdot \pi \cdot LO\_Ph\_Err\_cor)$$

where cos is the cosine function, sin is the sinus function and j is the square root of −1.

This calculation can be performed by using LUT 740 or any other method for calculating the sin, cos, or complex exponent of a number.

Complex multiplier 750 then multiplies the incoming samples SMP_In 710 with LO_Comp[n] 730 to produce the compensated SMP_Out[n]=SMP_In[n] · LO_Comp[n] (760). If SMP_In 710 is a sequence of real numbers, produced by a single ADC, the imaginary part is zeroed before entering the Complex multiplier 750. The DDC output sampled signal sequence—SMP_Out 760—will have significantly less phase jitter and frequency drift, compared to the original IF. SMP_Out 760 can then be used for further processing in the DSPHW (120 of FIG. 1) to demodulate, decode, and extract information bits from a digitally modulated signal.

Figure 8:
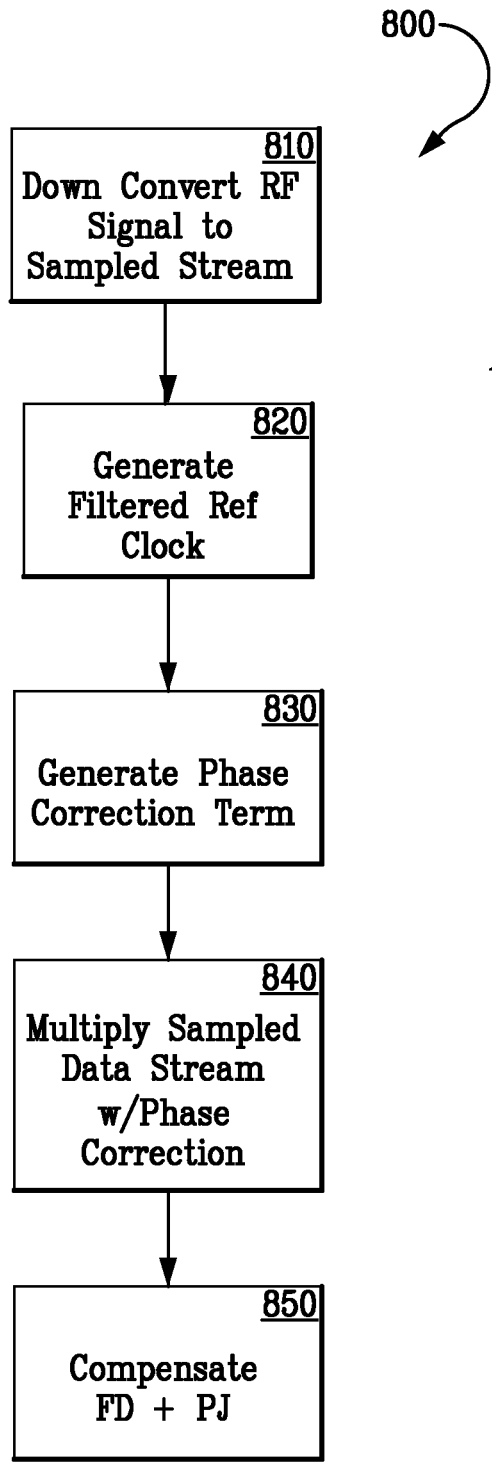
FIG. 8 illustrates a method for compensating local oscillator phase jitter.

FIG. 8 illustrates a method 800 for compensating local oscillator phase jitter and in accordance with the system implementations detailed above. In step 810, a radio frequency signal is down converted to a sample stream. This sampled stream may be of an intermediate frequency using a digitally controller oscillator.

In step 820, a filtered reference clock signal is generated followed by a phase correction term at step 830. This phase correction term as referenced in method 800 is generated using a local oscillator signal and external clock source; the filtered reference clock signal of step 820 may be generated at Ref_DPLL as illustrated in FIG. 3. The generated term of FIG. 8 includes an estimate of LO frequency drift and phase jitter. The phase correction term generated in step 830 in then multiplied with the sampled data stream of step 810 at step 840.

As a result of the multiplication operation of step 840, compensation for frequency drift and phase jitter introduced by the digitally controlled oscillator may occur at compensation operation 850. As a result of compensation operation 850, a digital receiver system implementing such a methodology (and corresponding hardware) may enjoy significant power and cost advantages over a traditional voltage controlled oscillator that would otherwise be controlled by a phase locked loop.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A method for generating a local oscillator output, the method comprising:
   receiving an intermediate frequency input, a reference clock input, and a local oscillator feedback input, the intermediate frequency input received from an analog-to-digital converter, and the local oscillator feedback input received from a tuner;
   filtering the reference clock input to produce a filtered version of the reference clock input;
   generating a phase error correction signal based at least in part on the filtered version of the reference clock input and a phase of the local oscillator feedback input;
   generating the local oscillator output based at least in part on the intermediate frequency input and the phase error correction signal; and
   providing the local oscillator output.

2. The method of claim 1, wherein the local oscillator feedback input is based at least in part on at least one of the local oscillator output and a frequency divided version of the local oscillator feedback input.

3. The method of claim 1, wherein the reference clock input is received from an oscillator.

4. The method of claim 1, wherein the intermediate frequency input is based at least in part on at least one of a zero intermediate frequency and samples of an intermediate frequency.

5. The method of claim 4, wherein the samples comprise at least one of a complex number sequence from two analog-to-digital converters and a real number sequence from one analog-to-digital converter.

6. The method of claim 1, wherein generating the filtered version of the reference clock input includes determining a phase error, the phase error being proportional to an accumulated phase difference between the reference clock input and the local oscillator feedback input.

7. The method of claim 1, wherein generating a phase error correction signal includes comparing a phase of the filtered version of the reference clock input to a phase of the local oscillator feedback input.

8. The method of claim 1, wherein generating the local oscillator output includes generating a local oscillator compensation signal at least in part by rotating the phase of the intermediate frequency input by a phase amount specified by the phase error correction signal.

9. The method of claim 8, wherein rotating the phase of the intermediate frequency input is at least in part calculated using a look up table.

10. The method of claim 8, wherein generating the local oscillator output further includes generating the local oscillator output at least in part by multiplying the intermediate frequency input with the local oscillator compensation signal.

11. The method of claim 8, wherein rotating the phase of the intermediate frequency input is at least in part calculated using a look up table.

12. The method of claim 8, wherein generating the local oscillator output further includes generating the local oscillator output at least in part by multiplying the intermediate frequency input with the local oscillator compensation signal.

13. A method for recovering information from a communications channel, the method comprising:
receiving the communications channel, an intermediate frequency, a reference clock input, and a local oscillator feedback input;
generating a filtered version of the reference clock input;
generating a phase error correction signal based at least in part on the filtered version of the reference clock input and a phase of the local oscillator feedback input;
generating the local oscillator output based at least in part on the intermediate frequency input and the phase error correction signal;
down converting the communications channel to the intermediate frequency based at least in part on the local oscillator output; and
determining a digital representation of the down converted communications channel at least in part by sampling the down converted communications channel.

14. The method of claim 13, wherein the local oscillator feedback input is based at least in part on at least one of the local oscillator output and a frequency divided version of the local oscillator feedback input.

15. The method of claim 13, wherein the reference clock input is received from an oscillator.

16. The method of claim 13, wherein the intermediate frequency input is based at least in part on at least one of a zero intermediate frequency and samples of an intermediate frequency.

17. The method of claim 16, wherein the samples comprise at least one of a complex number sequence from two analog-to-digital converters and a real number sequence from one analog-to-digital converter.

18. The method of claim 13, wherein generating the filtered version of the reference clock input includes determining a phase error, the phase error being proportional to an accumulated phase difference between the reference clock input and the local oscillator feedback input.

19. The method of claim 13, wherein generating a phase error correction signal includes comparing a phase of the filtered version of the reference clock input to a phase of the local oscillator feedback input.

20. The method of claim 13, wherein generating the local oscillator output includes generating a local oscillator compensation signal at least in part by rotating the phase of the intermediate frequency input by a phase amount specified by the phase error correction signal.

* * * * *